United States Patent [19]

Hawrylo et al.

[11] 4,233,090
[45] Nov. 11, 1980

[54] METHOD OF MAKING A LASER DIODE

[75] Inventors: Frank Z. Hawrylo, Trenton; Henry Kressel, Elizabeth, both of N.J.

[73] Assignee: RCA Corporation, New York, N.Y.

[21] Appl. No.: 52,787

[22] Filed: Jun. 28, 1979

[51] Int. Cl.³ .......................................... H01L 21/208
[52] U.S. Cl. .................................. 148/171; 29/569 L; 148/172; 148/187; 148/33.5; 331/94.5 H; 357/16
[58] Field of Search .............. 148/171, 172; 29/569 L; 331/94.5 H; 357/16

[56] References Cited

U.S. PATENT DOCUMENTS

| | | | |
|---|---|---|---|
| Re. 29,866 | 12/1978 | Yonezy | 331/94.5 H |
| 3,692,593 | 9/1972 | Hawrylo et al. | 148/172 |
| 3,741,825 | 6/1973 | Lockwood et al. | 148/171 |
| 3,962,716 | 6/1976 | Petroff et al. | 357/16 X |
| 3,982,261 | 9/1976 | Antypas | 357/16 |
| 3,984,261 | 10/1976 | Hawrylo | 148/33 |
| 4,008,106 | 2/1977 | Gutierrez et al. | 148/172 |
| 4,088,515 | 5/1978 | Blakeslee et al. | 148/175 |
| 4,137,107 | 1/1979 | Nijman et al. | 148/171 |

Primary Examiner—G. Ozaki
Attorney, Agent, or Firm—Birgit E. Morris; Donald S. Cohen

[57] ABSTRACT

In making a laser diode by a method which includes epitaxially depositing a plurality of layers of a semiconductor material on a substrate, the final outermost layer deposited is of a material which has a band-gap lower than the preceding adjacent layer, which readily accepts a conductivity modifier, which can be selectively etched from the preceding adjacent layer and which preferably has a lattice parameter substantially equal to that of the preceding adjacent layer. A conductivity modifier is then diffused along a narrow stripe into and through the outermost layer, into the preceding adjacent layer. The outermost layer is then etched away to expose the surface of the preceding adjacent layer and a metal contact is applied to the exposed surface.

6 Claims, 3 Drawing Figures

METHOD OF MAKING A LASER DIODE

BACKGROUND OF THE INVENTION

The present invention relates to a method of making a laser diode and particularly to such a method which provides for good electrical contact to the diode.

Recently there have been developed several different structures of semiconductor lasers which are capable of continuous operation at room temperature. One structure, as shown in U.S. Pat. No. 3,740,661 of L. A. D'Asaro, entitled "MINOR LOBE SUPPRESSION IN SEMICONDUCTOR INJECTION LASERS", issued June 19, 1973, uses a stripe contact on one surface of the semiconductor body to achieve confinement of the path of the electrical current across the active region of the laser. However, this structure has the disadvantage that the current spreads out as it passes across the body of the laser so that the width of the active region is difficult to control.

To overcome this problem a structure has been developed in which current confinement is achieved by a narrow diffused region extending from the surface of the body to a point adjacent the active region of the laser. Such a structure is shown in U.S. Pat. No. 29,866 to H. Yonezu, entitled "DOUBLE HETEROSTRUCTURE STRIPE GEOMETRY SEMICONDUCTOR LASER DEVICE" issued Dec. 19, 1978. A problem with this structure is in achieving good electrical contact to the surface of the semiconductor body having the diffused stripe therein. Because of the type of materials generally used for the laser, it is difficult to achieve a high concentration of conductivity modifiers at the surface of the stripe to provide a low resistance contact to the stripe. The laser is generally made by epitaxially growing the various layers on a substrate; because of the materials used it is difficult to achieve good adhesion of the metal contact layer to the finally grown layer.

SUMMARY OF THE INVENTION

A semiconductor laser is made by epitaxially depositing in succession on a substrate a plurality of layers of single crystalline semiconductor material to form an active region having heterojunctions on each side thereof. The outermost layer is of a material which (1) readily accepts a conductivity modifier, (2) has a band gap lower than that of the preceding adjacent layer, and (3) can be selectively etched from the preceding adjacent layer. A conductivity modifier is diffused along a narrow stripe into and through the outermost epitaxial layer and into the preceding adjacent layer. The outermost layer is then etched away.

DETAILED DESCRIPTION

In making a laser diode by the method of the present invention the various layers which make up the final laser diode are epitaxially deposited in succession on a substrate. The material used to make the laser diode is generally a Group III-V compound or alloys of such compound. The method of the present invention will be described using InP and InGaAsP as the materials for the various layers. However, as will be explsined later, other combinations of the Group III-V compounds can be used. Although various epitaxial techniques can be used for depositing the layers, a preferred technique is liquid phase epitaxy, i.e., depositing the material from the liquid phase.

A suitable apparatus and method for depositing the layers by liquid phase epitaxy is shown and described in U.S. Pat. No. 3,753,801 to H. F. Lockwood et al entitled, "METHOD OF DEPOSITING EPITAXIAL SEMICONDUCTOR LAYERS FROM THE LIQUID PHASE", issued Aug. 21, 1973 which is incorporated herein by reference. Basically, the apparatus includes a furnace boat having a plurality of spaced wells in the top surface thereof and a substrate-carrying slide movable through the furnace boat and across the bottom of each of the wells. Each of the wells contains a liquid source from which a layer is to be deposited. The slide carries the substrate into each of the wells where it is brought into contact with the source to permit the layer to be deposited on the substrate. For depositing thin layers, small amounts of the solution are used in the well and a weight is placed on the solution to spread the solution completely across the substrate.

Each of the source solutions is made up of the desired semiconductor material and a suitable conductivity modifier dissolved in a metal solvent. The solutions are heated to a temperature at which the semiconductor material and the conductivity modifier are completely dissolved in the solvent. The substrate is moved into each of the wells in succession and, while in contact with the solution in the well, the temperature of the solution is lowered to precipitate out the semiconductor material and deposit it on the surface of the substrate. The deposition of the semiconductor material also carries along some of the conductivity modifier. Prior to placing the substrate in the solution, the solution is generally saturated with the semiconductor material by means of a source wafer of the semiconductor material which is either carried by the slide ahead of the substrate or is within the well on top of the solution.

Figure 1:
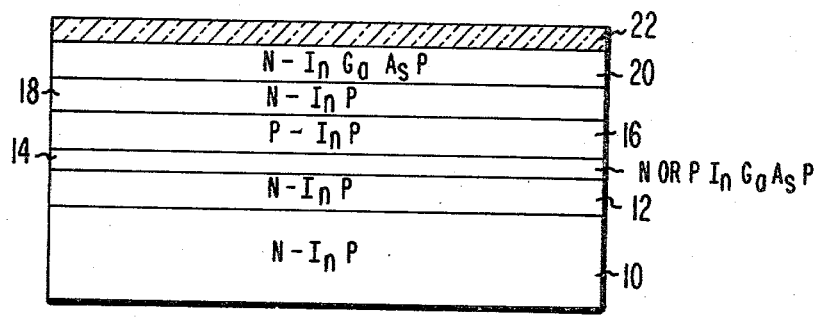
FIGS. 1-3 are sectional views illustrating the various steps of the method of the present invention.

Referring to FIG. 1, the substrate 10 used is of N type InP and a first layer 12 of N type InP is deposited thereon using the above-described liquid phase epitaxy technique. The second layer 14 is a thin layer of InGaAsP which may be either N type or P type. The second layer 14 forms the active region of the semiconductor laser. On the second layer 14 is a third layer 16 which is of P type InP. The first layer 12 and the third layer 16 form heterojunctions with the second layer 14 which serve to confine light generated in the active region second layer 14 therein. Over the third layer 16 is a fourth layer 18 of N type InP which serves as the capping layer for the laser diode. Finally, a fifth layer 20 is deposited on the fourth layer 18. The fifth layer 20 must be of a material having the following characteristics: (1) it must have a band gap lower than that of the material of the fourth layer 18; (2) it must readily accept a P type dopant; (3) it must be able to be selectively etched from the material of the fourth layer 18, and (4) it must have a lattice parameter preferably the same as, but at least as close as possible to, that of the material of the fourth layer 18. For a fourth layer made of InP, InGaAsP meets all of the above requirements and is highly suitable for use as the fifth layer. However, other materials such as InGaAs, InAsP, and GaAsSb can also be used for the fifth layer 20 when the fourth layer 18 is InP.

The first, third and fourth layers, 12, 16 and 18 respectively, of InP can be deposited from a solution of InP in indium as the solvent. Tin may be used as the N type dopant for the first layer 12 and zinc for the P type dopant for the third layer 16. The solution for the fourth layer 18 may contain no dopant and the layer deposited will have an inherent N type conductivity which is sufficient for the purpose of the fourth layer. The second and fifth layers 14 and 20, respectively, of InGaAsP can be deposited from a solution of a mixture of InP, InAs and GaAs in indium as the solvent. The solution for the second layer 14 may be undoped or include tin to achieve an N type layer or zinc to achieve a P type layer. The solution for the fifth layer 20 may contain no dopant and the layer deposited will have an inherent N type conductivity which is sufficient for the purpose of the fifth layer 20.

Figure 2:
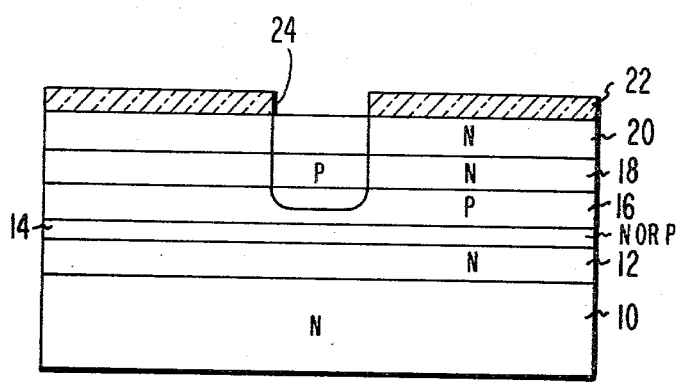

After the semiconductor material layers 12–20 are deposited on the substrate 10, the device is removed from the furnace boat. A masking layer 22, such as of silicon oxide, is then deposited on the surface of the fifth layer 20. The silicon oxide layer can be deposited by the well known technique of chemical vapor deposition, such as by heating silane in an atmosphere containing oxygen at a temperature at which the silane decomposes to form silicon oxide which then deposits on the fifth layer 20. As shown in FIG. 2, a stripe shaped opening 24 is then formed in the masking layer 22. This may be achieved by forming a photoresist layer on the masking layer 22 developed to form the opening 24 using standard photolithographic techniques, and then etching away the exposed portion of the masking layer 22.

The device is then exposed to an atmosphere containing a P type conductivity modifier, such as zinc, at a temperature which causes the zinc to diffuse into the exposed surface of the fifth layer 20, typically about 600° C. As previously stated the fifth layer 20 is of a material which will readily accept the conductivity modifier so that the fifth layer 20 will accept a high concentration of the P type conductivity modifier. By continuing the heating of the device, the P type conductivity modifier will then diffuse from the fifth layer 20 in the form of a narrow stripe through the fourth layer 18 and into the third layer 16. The diffusion is carried out long enough to cause the conductivity modifier to penetrate to a point adjacent the junction between the third layer 16 and the second layer 14.

The masking layer 22 is then removed with a suitable etchant. Then the fifth layer 20 is removed with an etchant which selectively removes the material of the fifth layer 20 but has little or no effect on the material of the fourth layer 18. Using InGaAsP as the fifth layer 20, it can be selectively etched away using either nitric acid or a mixture of 6 parts of nitric acid, 3 parts of acetic acid, one part of hydrofluoric acid to 50% by volume water.

Figure 3:
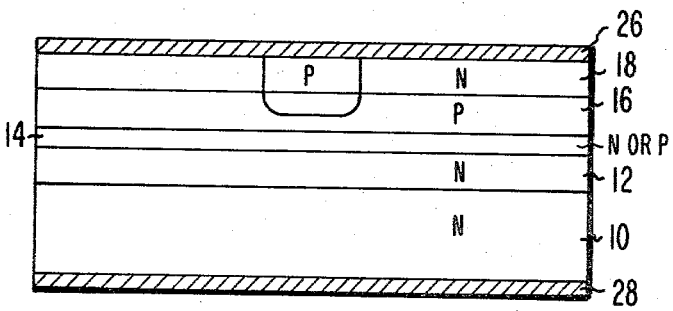

Finally, as shown in FIG. 3, metal contacts 26 and 28 are then coated on the surface of the fourth layer 18 and the substrate 10, respectively. The metal contacts 26 and 28 may be of any metal which forms an ohmic contact with the particular material of the fourth layer 18 and the substrate 10. For N type InP a metal contact of tin alloyed to the InP and covered with a thin layer of nickel coated with a thin layer of gold has been found to be suitable. For the P type contact 26 an alloy of gold and zinc is suitable.

In the method of the present invention, although the fifth layer 20 does not become part of the final laser diode, it serves a number of important purposes. Since the fifth layer 20 is of a material which readily accepts the P type conductivity modifier which forms the P type stripe, the fifth layer 20 will contain a high concentration of the P type conductivity modifier, particularly at its interface with the fourth layer 18. Thus, when the P type conductivity modifier is diffused into the fourth layer 18 there will be a high concentration of the conductivity modifier at the interface with the fifth layer 20 so that when the fifth layer 20 is removed, the surface of the fourth layer 18 will have a high concentration of the conductivity modifier and will thus have a high conductivity. In fact, the conductivity of the surface of the fourth layer 18 will be higher than if the conductivity modifier was diffused directly into the fourth layer rather than through the fifth layer 20. The high conductivity at the surface of the fourth layer 18 provides for a better ohmic contact between the metal contact layer 26 and the P type region of the fourth layer 18.

Another advantage of using the fifth layer 20 is that after it is removed, the fourth layer 18 is provided with a fresh, smooth surface to which the metal contact layer 26 will readily adhere. If growth of the various layers was stopped after the deposition of the fourth layer 18, the surface of the fourth layer would probably be rough because of any solution which might remain on the surface. Since the fifth layer 20 is of a material whose lattice parameter is close to or the same as that of the material of the fourth layer 18 there is little, if any, dislocation at the interface of the fourth and fifth layers. Thus, when the fifth layer 20 is etched away there is provided a good surface to which the metal contact 26 is applied. Since the fifth layer 20 is of a material which can be selectively etched with regard to the material of the fourth layer 18, the fifth layer 20 is easily removed from the fourth layer and the etching automatically stops when the fourth layer 18 is reached.

Still another advantage to use of the fifth layer 20 is that it serves to protect the fourth layer 18 during the diffusion of the P type dopant into the device. Because of the volatility of some of the elements of the Group III-V compounds, such as phosphorus, these compounds can dissociate when heated. The fifth layer 20 prevents any such dissociation of the material of the fourth layer 18 during the heating of the device while the diffusion of the P type conductivity modifier is carried out.

As previously stated, although the laser diode has been described hereinabove as being made of InP and InGaAsP, the method of the present invention can be used to make laser diodes using other Group III-V compounds and alloys thereof. For example, the method can be used to make a laser diode of the type shown and described in U.S. Pat. No. RE 29,866 which uses a GaAs substrate, a first layer of AlGaAs, a second layer of GaAs, a third layer of AlGaAs and a fourth layer of GaAs. To make this type of laser diode by the method of the present invention, a fifth layer of InGaAs could be used over the GaAs fourth layer. Thus, the method of the present invention can be used to make a laser diode which is formed of any of the Group III-V compounds and alloys thereof as long as the fifth layer is of a material having the characteristics previously described.

We claim:

1. In a method of making a semiconductor laser in which a plurality of layers of single crystal semiconductor material are epitaxially deposited in succession on a substrate to form an active region having heterojunctions on each side thereof and a conductivity modifier is diffused along a narrow stripe into the outermost of the epitaxial layers to a depth adjacent the active region, the improvement comprising:

(a) depositing as the outermost layer a layer of a material which (1) readily accepts the conductivity modifier, (2) has a band-gap lower than the preceding adjacent layer, and (3) can be selectively etched from the preceding adjacent layer, (b) diffusing the conductivity modifier through the said outermost layer into the preceding adjacent layer, and then (c) etching away said outermost layer to expose the surface of the preceding adjacent layer.

2. The method in accordance with claim 1 including the steps of coating the exposed surface of the preceding adjacent layer with a metal layer which makes ohmic contact with the diffused stripe.

3. The method in accordance with claim 1 in which the outermost layer is etched with an etchant which selectively etches the material of the outermost layer but not the preceding adjacent layer.

4. The method in accordance with claim 1 in which the preceding adjacent layer is of InP and the outermost layer is of InGaAsP.

5. The method in accordance with claim 1 in which the preceding adjacent layer is of GaAs and the outermost layer is of InGaAs.

6. The method in accordance with claim 1 wherein the outermost layer is coated with a masking layer having an opening therethrough to the surface of the outermost layer in the form of a narrow stripe, the exposed section of the outermost layer is exposed to a vapor containing the conductivity modifier and the device is heated to cause the conductivity modifier to diffuse into and through the outermost layer.

* * * * *